United States Patent [19]

Wheatley, Jr. et al.

[11] 3,836,995

[45] Sept. 17, 1974

[54] SEMICONDUCTOR DARLINGTON CIRCUIT

[75] Inventors: Carl Franklin Wheatley, Jr., Somerset; Willem Gerard Einthoven, Belle Mead, both of N.J.

[73] Assignee: RCA Corporation, New York, N.Y.

[22] Filed: May 25, 1973

[21] Appl. No.: 363,881

[52] U.S. Cl. .......................................... 357/46
[51] Int. Cl. .......................................... H01l 12/00
[58] Field of Search .......... 317/235, 40.13, 44, 47.1

[56] References Cited

UNITED STATES PATENTS 3,596,150 7/1971 Berthold et al. .................... 317/235
3,624,454 11/1971 Adkinson et al. .................... 317/101
3,755,722 9/1972 Harland et al. .................... 317/235

*Primary Examiner*—Rudolph V. Rolinec
*Assistant Examiner*—E. Wojciechowicz

[57] ABSTRACT

A semiconductor integrated Darlington circuit is provided comprising two transistors, two resistors, and a diode within a body of semiconductor material. The emitter region of one of the transistors completely encircles the emitter region of the other transistor at a surface of the body, whereby certain paths for current from the base contact of the one transistor beneath and around the emitter region thereof are significantly longer than those present in prior art devices, thus contributing to a higher value of one of the device resistors.

4 Claims, 5 Drawing Figures

PATENTED SEP 17 1974 3,836,995

SHEET 1 OF 2

SEMICONDUCTOR DARLINGTON CIRCUIT

This invention relates to semiconductor integrated circuits, and particularly to integrated circuits of the "Darlington" type.

A widely used electronics circuit, known as a "Darlington" circuit, comprises two transistors, two resistors, and a diode. Such circuit is now commercially available in integrated form, i.e., each of the individual components of the circuit and the various electrical interconnections therebetween are included within a single chip or pellet of semiconductor material, the semiconductor chip being encapsulated in a package having three outwardly extending terminal leads.

While such integrated Darlingtons have proven guite successful, there is, as is usually the case, room for improvements both with respect to the operating characteristics of the device and the means for fabrication thereof. In particular, in connection with such presently commercially available devices as the RCA 2N6385 and the RCA 2N6388 there is a need for significantly increasing the resistance value of one of the two circuit resistors of these devices without increasing either the complexity or cost thereof.

THE DRAWING

DETAILED DESCRIPTION

Figure 1:
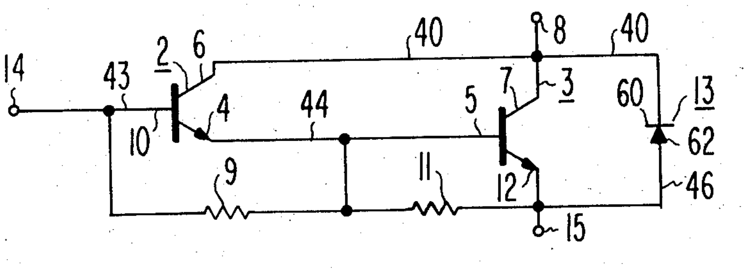
FIG. 1 is a schematic diagram of a Darlington circuit.

A schematic diagram of a Darlington circuit is shown in FIG. 1. The circuit includes a driving transistor 2 and a power output transistor 3 with the emitter 4 of the driver transistor 2 electrically connected to the base 5 of the power transistor 3. While the transistors 2 and 3 are shown as NPN devices, the circuit may also employ PNP transistors. The collector 6 and 7 of each transistor 2 and 3, respectively, is connected to a terminal 8. A first resistor 9 is connected between the base 10 and the emitter 4 of the driving transistor 2, and a second resistor 11 is connected between the base 5 and the emitter 12 of the power transistor 3. A diode 13 is connected between the emitter 12 and the collector 7 of the power transistor 3. The three terminal Darlington circuit function is thus defined between a common collector terminal 8, a terminal 14 connected to the base 10 of the driving transistor 2, and a terminal 15 connected to the emitter 12 of the power transistor 3.

Shown in FIGS. 2-5 and described with reference thereto is a semiconductor device which integrally contains all of the elements and interconnections of the circuit shown in FIG. 1. The device of this invention is similar to, but an improvement over, a commercially available device known as the RCA 2N6385, such device being described in pending application S.N. 199,880 filed Nov. 18, 1971. The device of the instant invention, generally referred to as 20, (FIG. 4) is formed in a semiconductor body 22 (e.g., silicon) having upper and lower opposed surfaces 24 and 26, respectively, and a side surface 27. An NPN device is shown in this embodiment. The device can also be of the PNP type.

The device 20 includes a highly conductive substrate 28 of the N type conductivity in the body 22 adjacent to the lower surface 26, and a collector region 30 of N type conductivity adjacent to the substrate 28. The device 20 further includes a base region 32 of the P type conductivity disposed in the body 22 between the upper surface 24 and the collector region 30. The base 32 and collector 30 regions are separated by a base-collector PN junction 31 which extends across the entire device 20 and intersects the side surface 27.

Figure 2:
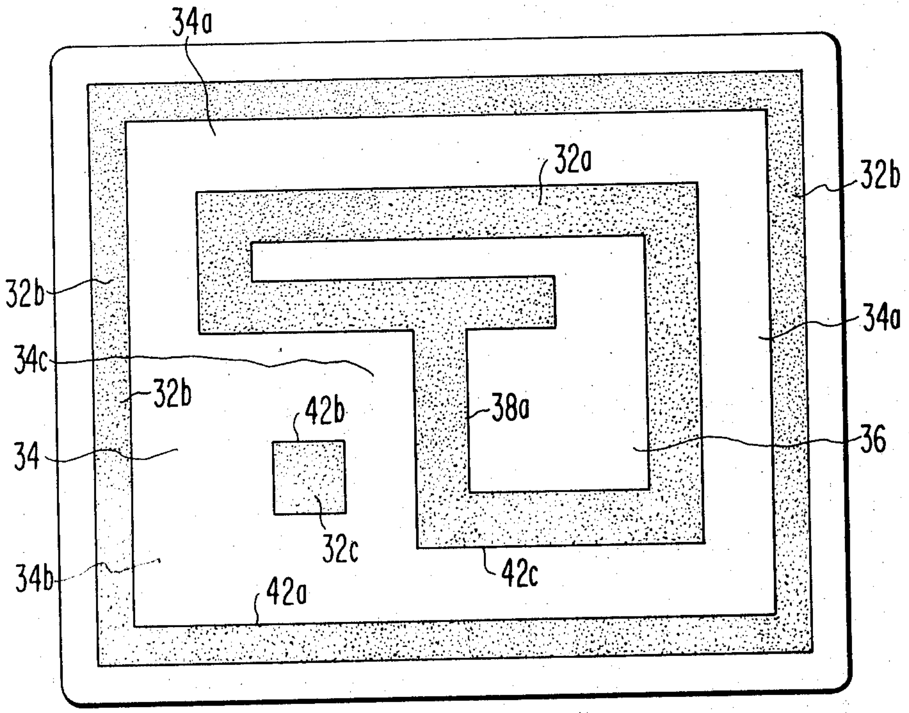
FIG. 2 is a top plan view of a semiconductor body containing various elements of the circuit of FIG. 1, the metallization pattern used to interconnect various ones of the elements not being present.
Figure 3:
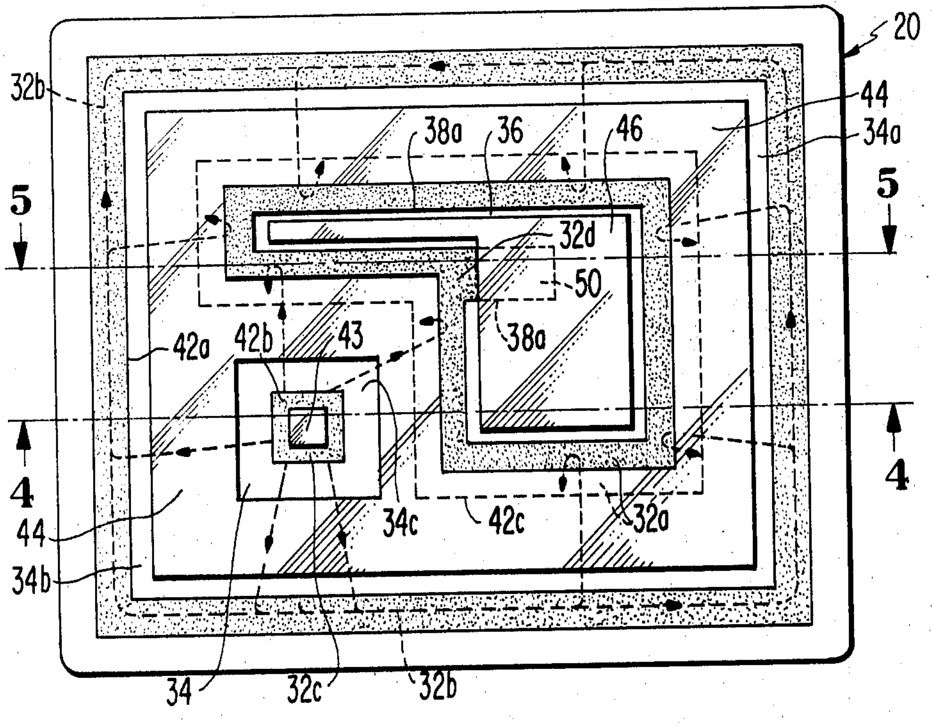
FIG. 3 is a view similar to that of FIG. 2, the metallization pattern, however, being present.
Figure 4:
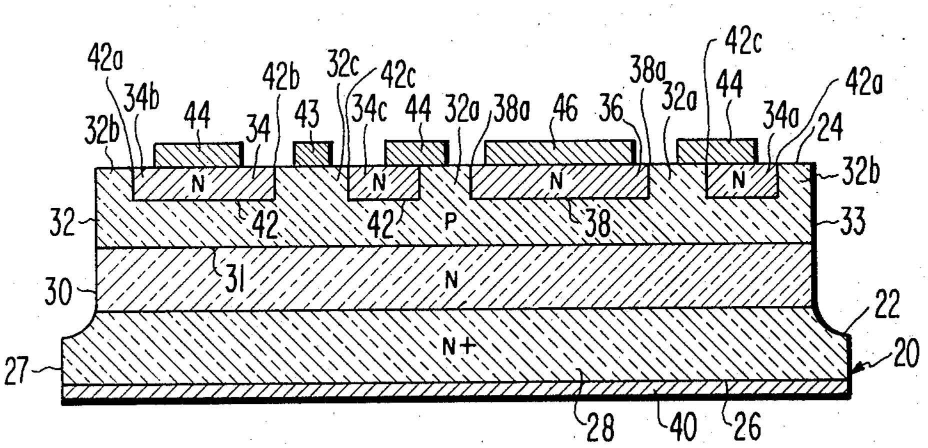
FIG. 4 is a cross-sectional view taken along the line 4—4 of FIG. 3.
Figure 5:
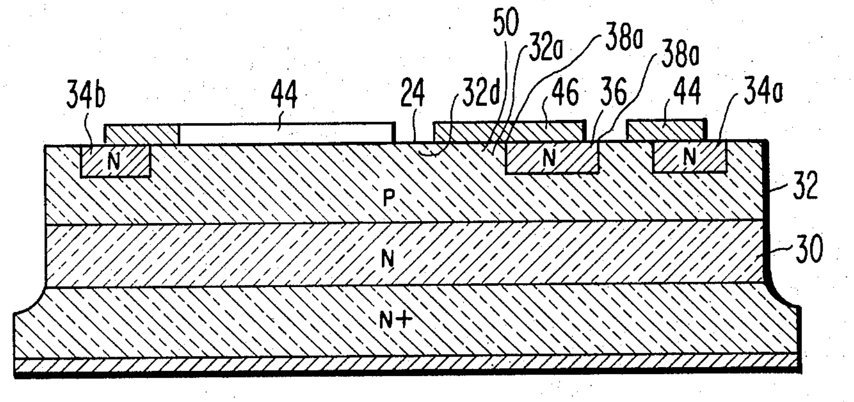
FIG. 5 is a cross-sectional view taken along line 5—5 of FIG. 3.

Extending into the base region 32 from the surface 24 of the body 22 are two emitter regions 34 and 36. For ease of visualization, the base region 32, where visible in FIGS. 2 and 3, is stippled. With reference to FIGS. 2 and 4, the emitter region 36, associated with the output transistor of the device, as hereinafter explained, is completely encircled by a portion **32*a* of the base region 32, the portion 32*a* extending to the surface 24 of the body 22. The emitter region 36 forms a PN junction 38 with the base region 32, the PN junction 38 having an intercept 38*a* with the surface 24 of the body 22**.

The other emitter region 34, associated with the driver transistor of the circuit, is likewise completely encircled by a portion of the base region 32, this encircling portion **32*b* being disposed about the upper periphery of the body 22. The emitter region 34 has a shape recognizable as that of a misshapen FIG. 8. One outer loop 34*a* of the emitter region 34 extends completely around the emitter 36 and is separated therefrom by the portion 32a of the base region 32. The other outer loop 34b of the emitter 34 surrounds a portion 32c of the base region 32. The two emitter loops 34*a* and 34*b* come together at a common loop segment 34*c*. The emitter 34 forms a PN junction 42 with the base region 32, the intercepts of the junction 42 with the surface 24 of the body 22 forming three closed loops 42*a*, 42*b*, and 42*c***.

To the extent so far described, the output transistor 3 of the Darlington circuit shown in FIG. 1 can be recognized as comprising the emitter region 36, the portion of the base region 32 forming the PN junction 38 with the emitter region 36, and the portion of the collector region 30 generally below these emitter and base portions.

The driver transistors 2 of the circuit comprises the portion of the emitter region 34 surrounding the base region portion **32*c*, the base region portion 32*c* forming the PN junction 42 with the emitter 34, and the portions of the collector region 30** below these emitter and base portions.

To provide the remaining components of the Darlington circuit and the interconnections therefor, metal contacts, e.g., of lead or a lead-tin alloy, are provided on the surfaces 24 and 26 of the body 22. Thus, as shown in FIG. 4, a metal contact 40 is provided on surface 26 ohmically contacting the substrate 28 and thus ohmically connected to the collector region 30 of both transistors of the circuit. A metal contact 43 is ohmically connected to the base region portion 32c surrounded by the emitter 34.

Two other metal contacts 44 and 46 are provided each connected to a different one of the emitters 34 and 36, respectively, and also to the base region 32. This is best shown in FIG. 3, wherein, for ease of visualization, the various metal contacts are shown shaded. Thus, as shown, the metal contact 46 is disposed substantially within the confines of the PN junction surface intercept 38a with the exception of an ohmic connection of the metal contact 46 with a tongue or channel 50 of the portion 32a of the base region 32 which extends into the emitter region 36 beneath the contact 46 (see also FIG. 5). The channel 50 provides the diode 13 of the circuit shown in FIG. 1, as hereinafter described.

The other metal contact 44 is ohmically connected to the emitter 34. As shown, the contact 44 is disposed entirely within the surface intercept 42*a* of the PN junction 42, and entirely surrounds, while not touching, the surface intercept 42*b*. With respect to the surface intercept 42*c* of the PN junction 42, however, the contact 44 extends over and beyond the entire length of the surface intercept 42*c* and is ohmically connected to the base portion 32*a* surrounding the emitter 36.

The Darlington circuit shown in FIG. 1 is comprised as follows.

The circuit interconnection between the collectors 6 and 7 of the two transistors 2 and 3, respectively, is the substrate region 28 and the contact 40 on the lower surface 26 of the body 22. The interconnection between the emitter 4 of the transistor 2 and the base 5 of the transistor 3 is the metal contact 44 (FIGS. 3 and 4) which contacts the emitter region 34 and the portion 32*a* of the base region 32. The diode 13, connected between the collector 7 and the emitter 12 of the transistor 3, comprises the channel 50 (FIGS. 3 and 5) of the base region 32 and the portion of the collector region 30 directly therebeneath. That is, the anode 60 of the diode 13 is the N conductivity type collector region 30, the diode cathode 62 is the P conductivity type channel 50, and the interconnection between the diode cathode 62 and the emitter 12 of the transistor 3 is the contact 46 which contacts both the channel 50 and the emitter region 36. The resistor 11 comprises the resistance of the portion 32*d* of the base region 32 between the edges of the two contacts 44 and 46 at the mouth of the channel 50.

The resistor 9 is a distributed resistance made up of several components, each of the components comprising a path for current from the base region contact 43, through the base region 32, beneath the emitter 34, and to the contact 44 where it extends over the emitter-base junction surface intercept 42*c* and contacts the base region portion 32*a*. Various ones of these current paths are indicated by arrowed lines in FIG. 3.

Owing to the FIG. 8 configuration of the emitter 34, one series of current paths between the contacts 43 and 44 is beneath the common loop segment 34*c* of the emitter. These paths are the shortest resistance paths and represent low resistance components of the resistor 9.

Other current paths are from the contact 43 to the base region 32 portions beneath the loop 34*b* (see FIG. 2) of the emitter, along the peripherally disposed base portions 32*b* surrounding the emitter 34, under the emitter loop 34*a* to the base portions 32*a*, and finally to the contact 44 (FIG. 3). These latter paths, some of which go half-way around the output transistor (the emitter 36) contribute high resistance components to the resistor 9 and provide much higher resistance values for the resistor 9 than is available in the aforementioned prior art devices.

That is, in the prior art device of which the instant invention is an improvement (i.e., the RCA 2N6385), the emitter of the driver transistor is substantially surrounded by the emitter of the output transistor, with a base region therebetween. The result of this is that all the current paths between the base contact of the driver transistor and the emitter contact thereof where it extends beyond the driver transistor base-emitter junction are relatively short. Thus, the resistor of such prior art devices corresponding to the resistor 9 of the circuit shown in FIG. 1 is much smaller in value than that of the resistor 9. In some instances, large value resistors 9 are greatly to be desired.

As above noted, the surrounding of the emitter region 36 by the loop 34a of the emitter region 34 contributes to long current paths and high resistance values. It is noted, however, that it is not the "surrounding" relation of the loop 34*a* with the emitter region 36 which gives rise to the high resistance values, but the elongated path provided by the loop 34*a*. Thus, high resistance values can still be obtained if the loop 34*a* is not closed and does not completely surround the emitter region 36. To the extent that the loop 34*a* does not completely surround the emitter region 36, and is some what shorter in length than it could be, the value of resistance of the resistor 9 is accordingly reduced.

What is claimed is:

1. A semiconductor integrated circuit comprising:

a body of semiconductor material having a surface, various regions within said body forming emitter, base, and collector regions of two transistors, said emitter and base regions extending into said body from said surface and being defined, at said surface, by surface intercepts of said regions, the surface intercept of the emitter region of one of said transistors surrounding a surface intercept of the base region of said one transistor, and substantially surrounding the surface intercept of the emitter region of the other of said transistors.

2. The integrated circuit of claim 1 wherein:

the emitter regions of said two transistors are separated by a portion of said base region at said surface, and including a metal contact on said surface, said metal contact being in ohmic contact with said surrounding emitter region and said portion of said base region separating said two emitter regions.

3. The integrated circuit of claim 2 wherein:

said surrounding emitter region is surrounded, at said surface, by another portion of said base region and forms a junction therewith, and said metal contact is disposed entirely within said junction.

4. A semiconductor integrated circuit comprising:

a body of semiconductor material having a surface, regions of P and N type conductivity extending into said body from said surface forming emitter and base regions of two transistors, said regions being defined, at said surface, by surface intercepts of said regions, the base regions of said two transistors being integral with one another and including portions thereof disposed beneath said emitter regions, said base region including first and second surface intercepts surrounding first and second surface intercepts, respectively, of said emitter regions, said emitter region first surface intercept surrounding a third surface intercept of said base region, said base region third surface intercept being spaced from said first and second base region surface intercepts and being surrounded by said base region first surface intercept, and said emitter region first surface intercept surrounding said base region second surface intercept, and metal contacts on said surface, one of said contacts ohmically connected to said first emitter region and having a first continuous edge disposed entirely within and out of contact with said base region first surface intercept, and a second edge surrounding and ohmically connected to said base region second surface intercept portion.

* * * * *